(12) United States Patent
Barthelmess et al.

(10) Patent No.: US 7,629,665 B2
(45) Date of Patent: Dec. 8, 2009

(54) SEMICONDUCTOR COMPONENT WITH A CHANNEL STOP ZONE

(75) Inventors: Reiner Barthelmess, Soest (DE); Hans-Joachim Schulze, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 573 days.

(21) Appl. No.: 11/428,988

(22) Filed: Jul. 6, 2006

(65) Prior Publication Data
US 2007/0007592 A1  Jan. 11, 2007

(30) Foreign Application Priority Data
Jul. 7, 2005  (DE) ........................ 10 2005 031 908

(51) Int. Cl.
*H01L 23/58* (2006.01)
(52) U.S. Cl. .................. 257/489; 257/197; 257/198; 257/487; 257/490; 257/565; 257/E29.027
(58) Field of Classification Search .................. 257/197, 257/198, 487, 489, 490, 565, 591, E29.027
See application file for complete search history.

(56) References Cited
U.S. PATENT DOCUMENTS
4,927,772 A * 5/1990 Arthur et al. ................. 438/140
5,864,167 A * 1/1999 Cutter ........................ 257/489
6,404,037 B1 * 6/2002 Finney ....................... 257/583
2003/0127702 A1 * 7/2003 Blair et al. .................. 257/510
2006/0086991 A1 4/2006 Barthelmess et al. ........ 257/401

FOREIGN PATENT DOCUMENTS
DE  10316222 B3  4/2003

* cited by examiner

*Primary Examiner*—Kiesha L. Rose
*Assistant Examiner*—Minchul Yang
(74) *Attorney, Agent, or Firm*—Coats & Bennett, P.L.L.C.

(57) ABSTRACT

A semiconductor component has a semiconductor body (100) having a basic doping and a first and second side, an inner region (103) arranged between the first and second sides, and an edge region (104) adjacent to the inner region in a lateral direction, at least one active component zone (12) which is arranged in the inner region (103) in the region of the first side (101) and is doped complementarily to the basic doping, and a channel stop zone (20), which is arranged in the edge region (104) in the region of the first side (101), is of the same conduction type as the basic doping and is doped more heavily than the basic doping, the doping concentration in the channel stop zone (20) decreasing continuously at least in sections in a lateral direction in the direction of the active component zone (12) at least over a distance (d1) of 10 μm.

16 Claims, 6 Drawing Sheets

SEMICONDUCTOR COMPONENT WITH A CHANNEL STOP ZONE

PRIORITY

This application claims priority from German Patent Application No. DE 10 2005 031 908.4, which was filed on Jul. 7, 2005, and is incorporated herein by reference in its entirety.

TECHNICAL FIELD

The present invention relates to a semiconductor component having a semiconductor body having an inner region with at least one active component zone and an edge region with a channel stop zone.

BACKGROUND

The provision of channel stop zones in semiconductor components is sufficiently known. Such channel stop zones, which are also referred to as channel stoppers, are used for example in power components, such as power diodes, power IGBTs or power MOSFETs. They serve for increasing the static blocking capability of the component in that they delimit a space charge zone that propagates in the direction of the edge when the component is turned off.

Particularly in the case of power components, extremely high current densities brought about by so-called current splitting operations can occur locally during operation, in particular during the turn-off processes. Such current splitting processes may be triggered by dynamic effects, in particular in combination with inhomogeneities in the region of an edge termination, such as, by way of example, inhomogeneities of the doping, the charge carrier lifetime or the surface or interface charge, but also external influences. Such external influences are for example a locally varying moisture at the surface of the semiconductor body.

In order to minimize the influence of such dynamic effects, it is known for a basic doping of the semiconductor body to be chosen to be as high as possible. However, this limits the static blocking capability and also the robustness toward cosmic radiation.

SUMMARY

A semiconductor component can be provided with a channel stop zone which has both a high static blocking capability and a high robustness toward dynamic effects, that is to say a high dynamic blocking capability.

In one embodiment, a semiconductor component comprises a semiconductor body having a basic doping and comprising a first side, a second side opposite the first side, an inner region arranged between the first and second sides, and an edge region adjacent to the inner region in a lateral direction, at least one active component zone which is arranged in the inner region in the region of the first side and is doped complementarily to the basic doping, and a channel stop zone, which is arranged in the edge region in the region of the first side, is of the same conduction type as the basic doping and is doped more heavily than the basic doping, the doping concentration in the channel stop zone decreasing continuously at least in sections in a lateral direction in the direction of the active component zone at least over a distance of 10 μm.

BRIEF DESCRIPTION OF THE DRAWINGS

The present invention is explained in more detail below with reference to the figures.

In the figures, unless specified otherwise, identical reference symbols designate identical component regions with the same meaning.

DETAILED DESCRIPTION

The doping concentration may decrease continuously at least over a distance of 25 μm. The doping concentration in the channel stop zone may decrease at least in sections in a vertical direction of the component in the direction of the second side. The channel stop zone may extend into the semiconductor body further than the active component zone in a vertical direction proceeding from the first side. The gradient of the doping concentration can be between $5 \cdot 10^{14}$ cm$^{-3}$/μm and $5 \cdot 10^{11}$ cm$^{-3}$/μm. The channel stop zone may have a first semiconductor zone and a second semiconductor zone, the second semiconductor zone being doped more heavily than the first semiconductor zone, and the doping concentration in the first semiconductor zone decreasing in a lateral and/or vertical direction proceeding from the second semiconductor zone. The doping concentration of the second semiconductor zone can be between $10^{17}$ cm$^{-3}$ and $10^{20}$ cm$^{-3}$. The maximum doping concentration of the first semiconductor zone can be between $10^{14}$ cm$^{-3}$ and $10^{16}$ cm$^{-3}$. The dimension of the first semiconductor zone in the lateral direction in the direction of the active component zone can be between 10 μm and 200 μm, preferably between 25 μm and 200 μm. The first semiconductor zone may have at least one of the following dopant atoms: phosphorus, selenium or sulfur. The second semiconductor zone may have at least one of the following dopants: phosphorus, selenium or sulfur. The second semiconductor zone may have phosphorus and selenium as dopant atoms.

In one embodiment, a semiconductor component comprises a semiconductor body having a basic doping and comprising a first side, a second side opposite the first side, an inner region arranged between the first and second sides, and an edge region adjacent to the inner region in a lateral direction, at least one active component zone which is arranged in the inner region in the region of the first side and is doped complementarily to the basic doping, and a channel stop zone, which is arranged in the edge region in the region of the first side, is of the same conduction type as the basic doping and is doped more heavily than the basic doping, the channel stop zone having a first semiconductor zone arranged in the region of the first side and a second semiconductor zone doped more heavily than the first semiconductor zone, the first semiconductor zone being adjacent to the second semiconductor zone at least in a lateral direction in the direction of the first active component zone, and the first semiconductor zone having an at least approximately homogeneous doping concentration.

The first semiconductor zone can be adjacent to the second semiconductor zone in the vertical direction in the direction of the second side.

Thus, a semiconductor component may have a semiconductor body having a basic doping and having a first side, a second side opposite the first side, an inner region arranged between the first and second sides, and an edge region adjacent to the inner region in a lateral direction.

At least one active component zone is arranged in the inner region of the semiconductor body in the region of the first side and is doped complementarily to the basic doping of the semiconductor body. Said active component zone may form one of the emitter zones in the case of a semiconductor component formed as a power diode, one of the base zones in the case of a component formed as an IGBT and the body zone in the case of a component formed as a MOSFET.

A channel stop zone is arranged in the region of the first side in the edge region of the semiconductor body, which channel stop zone is of the same conduction type as the basic doping but is doped more heavily than the basic doping. In order to optimize the dynamic blocking capability of the component, it is provided in this case that the doping concentration in the channel stop zone decreases continuously at least in sections in a lateral direction of the semiconductor body in the direction of the active component zone over a distance of at least 10 μm, preferably at least 25 μm. The gradient dN/dx with which the doping concentration decreases in the channel stop zone in the direction of the active component zone is preferably relatively small and lies for example between $5 \cdot 10^{14}$ cm$^{-3}$/μm and $5 \cdot 10^{11}$ cm$^{-3}$/μm. The dimension of the region of the channel stop zone in which the doping concentration decreases in the direction of the active component zone may be up to 200 μm.

In a conventional power component having a semiconductor body having an n-type basic doping and a homogeneously doped channel stop zone or a channel stop zone with a steep doping gradient in a lateral and vertical direction, locally high current densities in the region of the channel stop zone may have the effect that the basic doping of the semiconductor body is overcompensated by the electron concentration in the region around the channel stop zone. This may lead to a so-called "flipping over" of the profile of the electric field strength. The maximum of the electric field strength is thus shifted into the region of the "inner edge" of the channel stop zone, that is to say into the region of the boundary of the channel stop zone which faces the active component zone. In this case, the gradient of the field profile and the extent thereof are determined by the difference between the concentration of free electrons and the basic doping. In this case, the resulting field gradient is generally significantly steeper than the field gradient present in the static off-state case, as a result of which the dynamic blocking capability of the component is considerably reduced.

In the case of the component according to one embodiment, in which the doping concentration in the channel stop zone decreases at least in sections in the direction of the active component zone with a relatively small gradient of the dopant concentration and has a doping concentration that is not excessively high in this section, the doping of the channel stop zone, which is higher than the basic doping and decreases in the direction of the active component zone, in the dynamic off-state case, may at least partly compensate or else overcompensate for the charge of the free electrons present in the region of the channel stop zone, as a result of which a high dynamic blocking capability is achieved. In this case, the maximum doping concentration in the channel stop zone in the region of the decreasing doping should be adapted to the maximum electron concentration to be expected in the region of the channel stop zone in the dynamic off-state case and should correspond approximately to said electron concentration.

In order to achieve a sufficiently high static reverse voltage of the component, overall it is necessary to provide a sufficiently high dopant dose in the channel stop zone. In order to achieve this, although the channel stop zone has regions in which the doping is only a little above the basic doping, the channel stop zone according to one embodiment has comparatively large dimensions in a lateral and vertical direction in comparison with a conventional channel stop zone. The channel stop zone preferably extends into the semiconductor body further than the active component zone in a vertical direction proceeding from the first side.

In order to increase the static blocking capability, or in order to increase the total dopant dose in the channel stop zone, the channel stop zone preferably has a highly doped semiconductor zone arranged in the region of the first side. The more weakly doped semiconductor zone is adjacent to said highly doped semiconductor zone at least in a lateral direction in the direction of the active component zone, and in said more weakly doped semiconductor zone the doping concentration decreases in the direction of the active component zone. The doping concentration of the highly doped semiconductor zone lies for example between $10^{17}$ cm$^{-3}$ and $10^{20}$ cm$^{-3}$, and the maximum doping concentration of the more weakly doped semiconductor zone lies for example between $10^{14}$ cm$^{-3}$ and $5 \cdot 10^{16}$ cm$^{-3}$. This doping concentration of the more weakly doped semiconductor zone decreases to the basic doping of the semiconductor body in the direction of the active component zone. Said basic doping is $5 \cdot 10^{12}$ cm$^{-3}$ for components having a high blocking capability and may be up to $10^{14}$ cm$^{-3}$ depending on the desired blocking capability of the component.

Preferably, the doping of the channel stop zone also decreases at least in sections in a vertical direction of the semiconductor body in the direction of the second side. Given the presence of a highly doped semiconductor zone and a more weakly doped semiconductor zone with a small gradient of the doping profile, in this exemplary embodiment the more weakly doped semiconductor zone is also adjacent to the more heavily doped semiconductor zone in a vertical direction, the doping concentration in the more weakly doped semiconductor zone also decreasing in said vertical direction of the semiconductor body.

An alternative configuration of the channel stop zone provides for the latter to have a first semiconductor zone arranged in the region of the first side and a second semiconductor zone doped more heavily than the first semiconductor zone, the first semiconductor zone being adjacent to the second semiconductor zone at least in a lateral direction in the direction of the active component zone, and the first semiconductor zone being at least approximately homogeneously doped. The gradient of the doping concentration in the direction of the active component zone of the first semiconductor zone is thus at least approximately zero. In this case, the doping concentration of the first semiconductor zone is to be coordinated with the conditions prevailing during operation of the component such that the doping concentration approximately corresponds to the maximum electron concentration that occurs in the region of the channel stopper.

Figure 1:
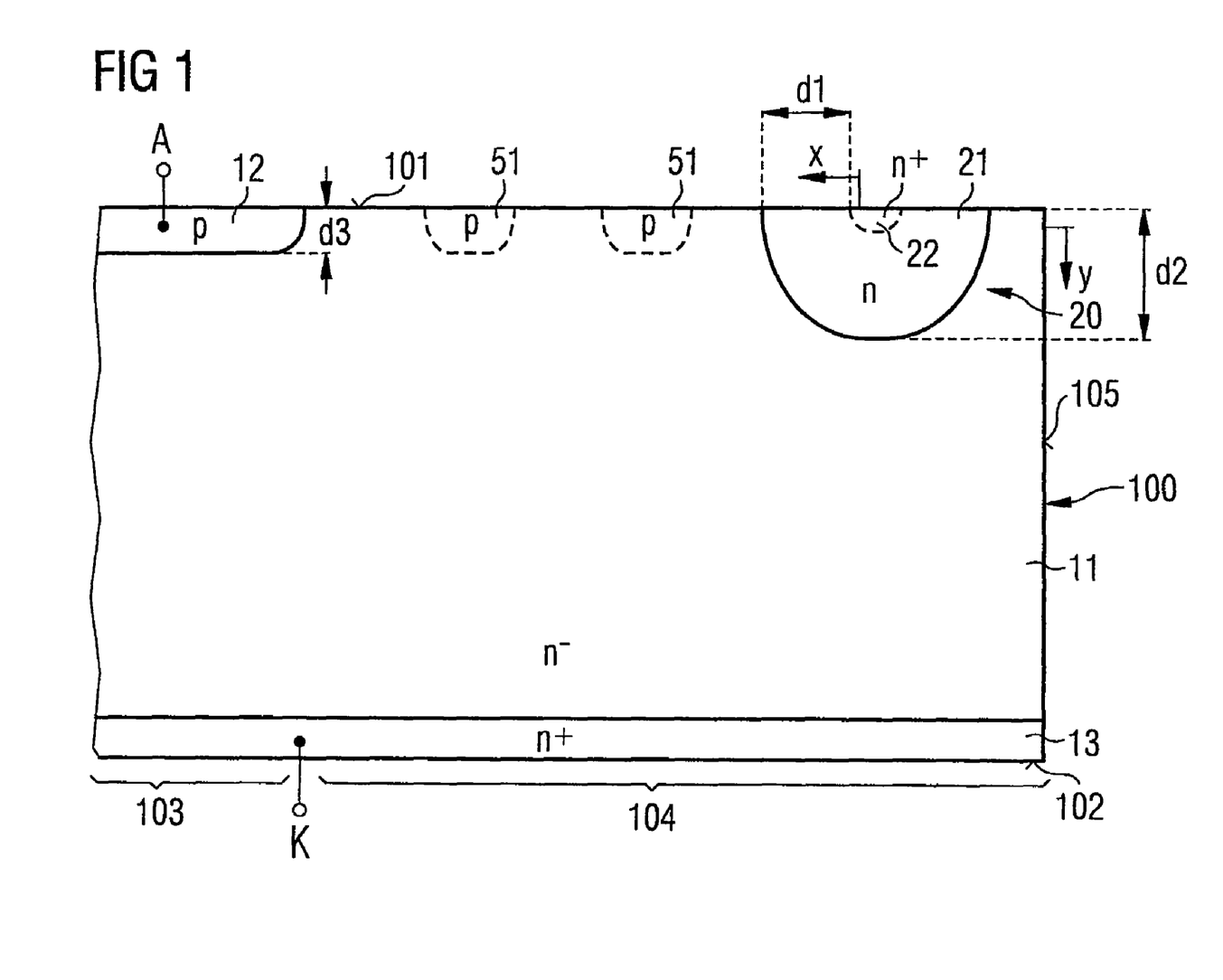
FIG. 1 shows a cross section through a semiconductor component formed as a diode and having a channel stop zone according to one embodiment.

FIG. 1 shows an exemplary embodiment of a semiconductor component formed as a diode and having a channel stop zone according to one embodiment. The component has a semiconductor body 100 having a first side 101, a second side 102 opposite the first side 101, an inner region 103 arranged between the first and second sides 101, 102, and also an edge region 104 adjacent to the inner region 103 in a lateral direction. It should be pointed out that the dimensions of the inner region 103, in a lateral direction of the semiconductor body 100, are significantly larger than the dimensions of the edge region 104, FIG. 1 merely illustrating a small section of said inner region 103.

The semiconductor body 100 has a basic doping corresponding to the doping which the semiconductor body has before the production of doped semiconductor zones that determine the properties of the component. A semiconductor region which still has the basic doping after the production of said further component zones and which makes up the greatest part of the volume of the semiconductor body is designated by the reference symbol 11 in FIG. 1.

An active component zone 12 doped complementarily to the basic doping is arranged in the inner region 103 of the semiconductor body 100 in the region of the first side 101, which forms the front side of the semiconductor body 100 in the example. The semiconductor body 100 has an n-type basic doping in the example. The complementarily doped active component zone 12 is thus p-doped. Said component zone 12 forms the p-type emitter of the diode in the example, contact being made with said emitter by means of an anode terminal A, which is merely illustrated schematically. A heavily n-doped semiconductor zone 13 is present in the region of the rear side 102 of the semiconductor body; this zone forms the n-type emitter of the diode and is connected to a cathode terminal K illustrated schematically. A section of the semiconductor body 100 that has the basic doping and is arranged in the inner region between the p-type emitter 12 and the n-type emitter 13 forms the n-type base of the diode.

A channel stop zone 20 is present in the edge region of the component 104 in a manner spaced apart from the p-type emitter 12 in a lateral direction of the semiconductor body 100; the doping type of said channel stop zone corresponds to the doping type of the basic doping of the semiconductor body 100, but it is doped more highly than the basic doping. The task of said channel stop zone 20 is to limit an electric field that propagates upon application of a reverse voltage between anode A and cathode K proceeding from the pn junction between p-type emitter 12 and n-type base 11, in order to prevent a punch-through of the electric field to an edge side 105 running between front side 101 and rear side 102.

The channel stop zone 20 has a first semiconductor zone 21, in which the dopant concentration decreases proceeding from a first concentration value in a lateral direction of the semiconductor body 100 in the direction of the active component zone 12. This lateral direction of the semiconductor body in the direction of the active component zone 12 is designated hereinafter as the x direction of the semiconductor body.

The channel stop zone 20 furthermore advantageously has a second semiconductor zone 22, which is doped more highly than the first semiconductor zone 21. Said second semiconductor zone 22 is adjacent to the section with decreasing doping of the first semiconductor zone 21 on the side remote from the active component zone 12.

Figure 2:
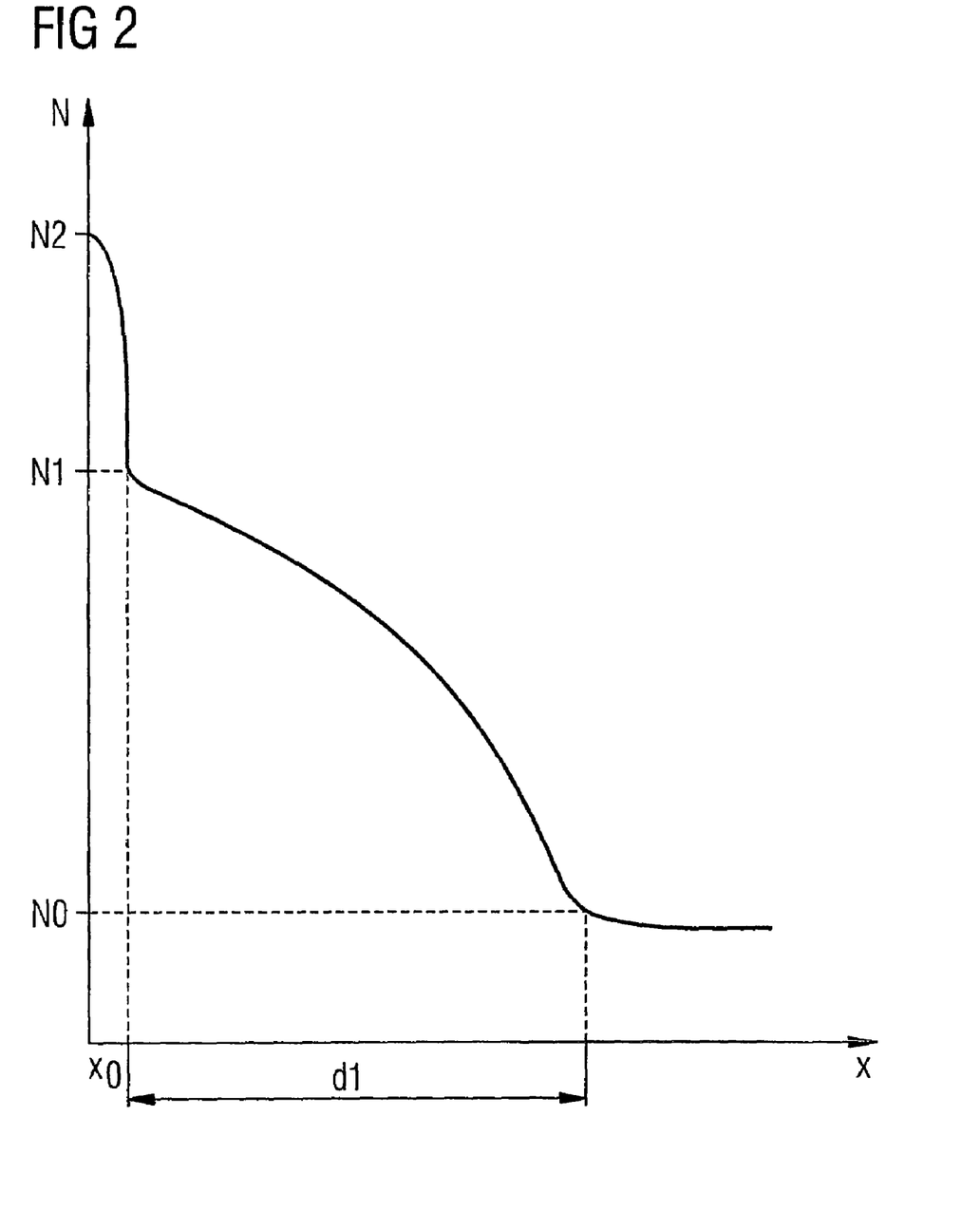
FIG. 2 illustrates the profile of the doping concentration in a section of the channel stop zone in the case of the component in accordance with FIG. 1.

In order to afford a better understanding of the doping concentrations, FIG. 2 shows by way of example the profile of the doping concentration in the channel stop zone 20 in the lateral x direction proceeding from a point x0 arranged at the center of the second semiconductor zone 22. In this case, FIG. 2 illustrates the profile of the doping concentration in a region of the channel stop zone 20 just below the first side or front side 101.

The doping concentration of the second semiconductor zone 22 is designated by N2 in FIG. 2. This doping concentration of the n-doped second semiconductor zone 22 is between $10^{17}$ cm$^{-3}$ and $10^{19}$ cm$^{-3}$, by way of example. In FIG. 2, N1 designates the maximum doping concentration of the section of the first semiconductor zone 21 that is adjacent to the second semiconductor zone 22 in a lateral direction. This maximum doping concentration is between $10^{14}$ cm$^{-3}$ and $5 \cdot 10^{16}$ cm$^{-3}$, by way of example.

The doping concentration in the transition region between the first semiconductor zone 21 and the second semiconductor zone 22 decreases relatively abruptly, that is to say with a very high gradient, from the second semiconductor zone 22 toward the first semiconductor zone 21. Within the first semiconductor zone 21, the doping concentration decreases in the lateral direction in the direction of the active component zone 12 continuously with a significantly smaller gradient than in the transition region between first and second semiconductor zones 21, 22, to the value of the basic doping of the semiconductor body 100. Said basic doping of the component is between $5 \cdot 10^{12}$ cm$^{-2}$ and $10^{14}$ cm$^{-2}$ depending on the desired blocking capability. The dimension d1 of the section of the first semiconductor zone 21 that runs in a lateral direction and in which the doping concentration decreases continuously is at least 10 μm, preferably at least 25 μm. The dimension d1 of said first zone in a lateral direction may be up to 200 μm in this case.

Taking account of the abovementioned maximum doping concentration and the minimum doping concentration at the edge of the first semiconductor zone 21, which corresponds to the basic doping, the gradient of the doping profile in the first semiconductor zone 21 is between $5 \cdot 10^{14}$ cm$^{-3}$/μm and $5 \cdot 10^{11}$ cm$^{-3}$/m. Said gradient preferably lies between $5 \cdot 10^{13}$ cm$^{-3}$/μm and $5 \cdot 10^{12}$ cm$^{-3}$/μm.

The total dopant dose of the channel stop zone 20 is chosen taking account of the desired static blocking capability of the component, in particular the highly doped second semiconductor zone 22 serving for setting the total dopant dose of the channel stop zone 20. The first semiconductor zone 21 having the dopant concentration that decreases in the direction of the active component zone 12 has the task of compensating, in the off-state case, for free charge carriers, that is to say free electrons, which may be situated in a high concentration in the region of said zone 21 e.g. during the turn-off process, in the region of the channel stop zone in order to minimize the effect of the "flipping over" of the electric field.

The first semiconductor zone 21 of the channel stop zone 20 is advantageously formed in such a way that the dopant concentration thereof also decreases in a y direction—running perpendicular to the lateral x direction—in the direction of the rear side 102 of the semiconductor body. The profile of the dopant concentration as illustrated in FIG. 2 preferably approximately also corresponds to the profile of the dopant concentration in this y direction.

In the exemplary embodiment illustrated in FIG. 1, the more weakly doped first semiconductor zone 21 surrounds the more heavily doped semiconductor zone 22 within the semiconductor body 100 on all sides. It should be pointed out in this context that an increase in the dynamic blocking capability of the component by providing the first semiconductor zone 21 having a shallow gradient of the doping profile is already achieved when said first semiconductor zone 21 is arranged between the highly doped second semiconductor zone 22 and the active component zone 12 in the lateral direction and advantageously adjacent to the highly doped second semiconductor zone 22 in the vertical direction. The presence of a more weakly doped semiconductor zone between the edge side 105 and the highly doped semiconductor zone 22 is not absolutely necessary.

Figure 3A:
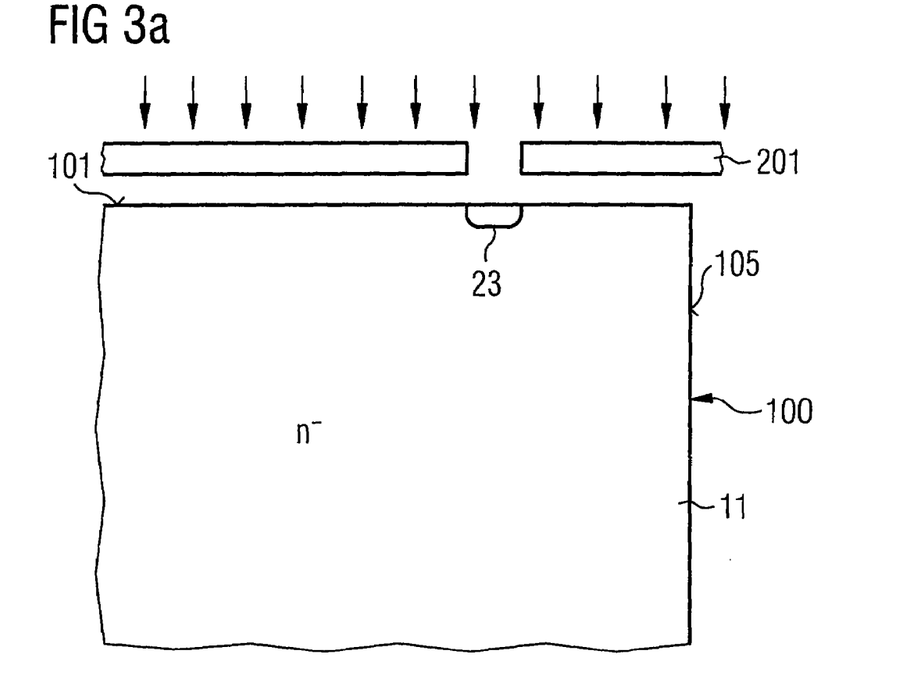
FIG. 3 illustrates one possible method for producing the channel stop zone according to one embodiment.

One possible method for producing the channel stop zone according to one embodiment is explained below with reference to FIGS. 3a and 3b. In this case, these figures show only a detail from the semiconductor body 100 in the region of the edge side 105 and the front side 101.

The method provides for implanting dopant atoms, for example selenium or sulfur atoms, into a region of the semiconductor body 100 near the surface, using a mask 201, in order to produce semiconductor zones 23 near the surface with dopant atoms introduced therein. The dose with which the dopant atoms are implanted is between $10^{12}$ cm$^{-2}$ and a few $10^{14}$ cm$^{-2}$, for example, when selenium is used as the dopant material.

Figure 3B:
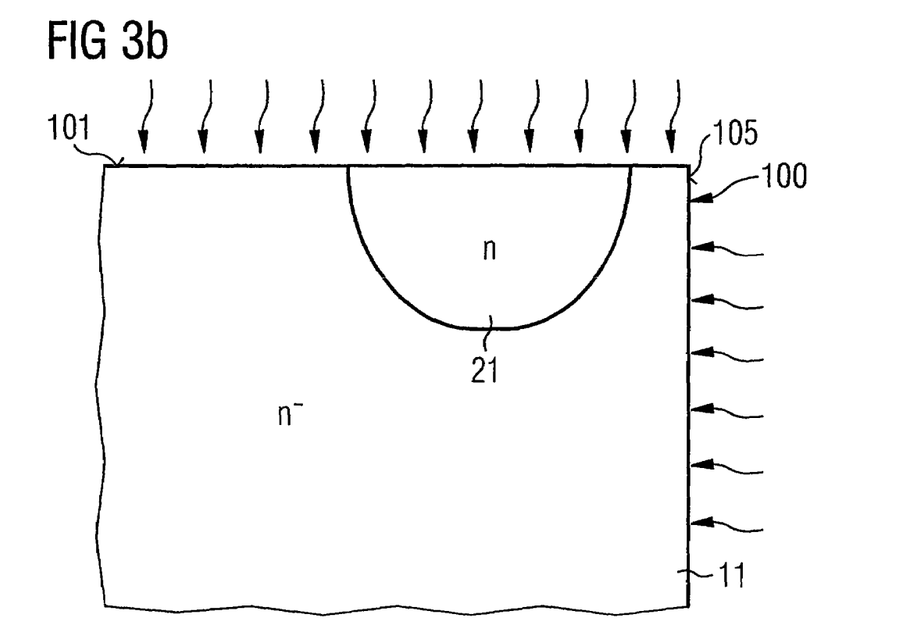

Referring to FIG. 3b, this implantation step is followed by a thermal step during which the semiconductor body 100 is heated to a predetermined temperature for a predetermined time duration. Said temperature lies between 900° C. and 1000° C., for example, when using selenium as dopant material. The duration of the thermal step is between 30 minutes and 5 hours. On account of this thermal process, the dopant atoms implanted into the semiconductor body 100 during the first step diffuse in all directions of the semiconductor body 100 proceeding from the implantation region 23, and thus also in a lateral direction of the semiconductor body 100 in the direction of the inner region 103 with the active component zone arranged therein (not illustrated in FIGS. 3a and 3b). The diffusion process has the effect that the doping concentration decreases in the lateral direction proceeding from the region 23, in which the dopant atoms were implanted, in all directions and thus also in a lateral direction of the semiconductor body 100, which results in the doping profile of the first semiconductor zone 21 that has been explained above and is illustrated in FIG. 2.

The production of a highly doped second semiconductor zone (22 in FIG. 1) in the first semiconductor zone 21 illustrated in FIG. 3b may be effected by means of a further implantation step (not illustrated), which results in further dopant atoms being implanted into a region of the semiconductor body 100 near the surface within the first semiconductor zone 21. Said further dopant atoms may be, by way of example, likewise selenium atoms or else phosphorus atoms. After the implantation, a high-temperature step is once again carried out for activation and indiffusion of the implanted atoms. For the case where the dopant atoms which produce the more weakly doped zone 22 diffuse more rapidly than the atoms implanted for producing the more heavily doped zone 22, it is also possible to carry out a joint high-temperature step for indiffusion of the atoms; that is to say that the implantation of the two substances for producing the more weakly doped zone 21 and the more highly doped zone 22 takes place directly successively and preferably using the same implantation masks.

Figure 4A:
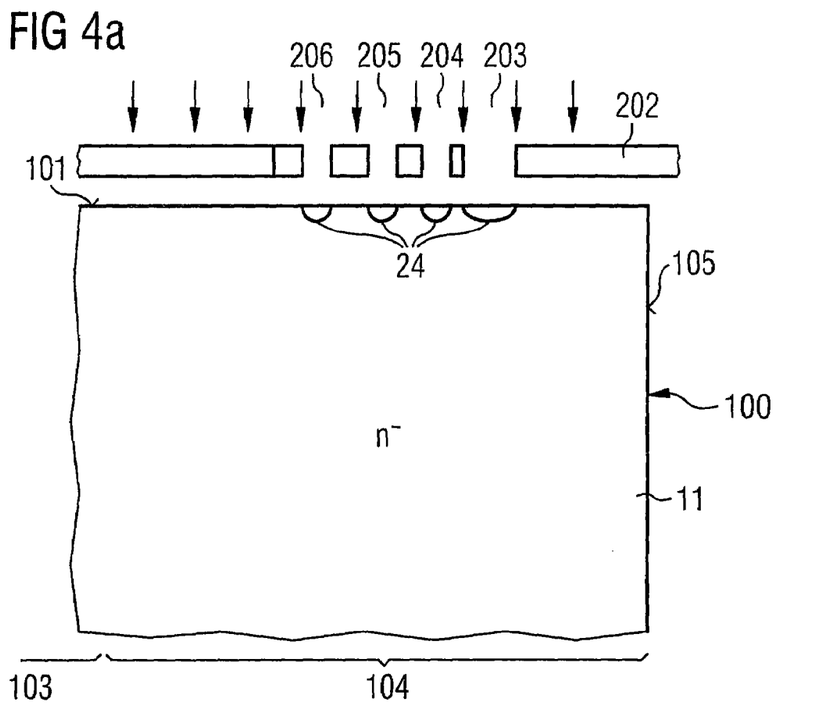
FIG. 4 illustrates a further method for producing the channel stop zone according to one embodiment.

FIG. 4 illustrates a further method for producing the channel stop zone according to one embodiment. This method is suitable in particular for doping the semiconductor body with a dopant material that diffuses slowly in comparison with selenium, such as phosphorus for example. Referring to FIG. 4a, this method provides for implanting dopant atoms via a mask 202 into a region of the first side 101 of the semiconductor body 100 that is near the surface. The mask 202 used has a plurality of openings 203-206, the size of which and/or the mutual distance between which is chosen such that the amount of dopant implanted into the semiconductor body 100 decreases in a direction of the active component zone. This may be achieved for example by virtue of the fact that the dimensions of the openings 203-206 decrease in the direction of the inner region 103 and/or that the distances between the individual openings increase in the direction of the inner region 103. This implantation step gives rise to a plurality of implantation regions 24 arranged in a manner spaced apart from one another in a lateral direction. The implantation dose is between $5·10^{12}$ cm$^{-2}$ and $10^{15}$ cm$^{-2}$, for example, for phosphorus as dopant material.

Figure 4B:
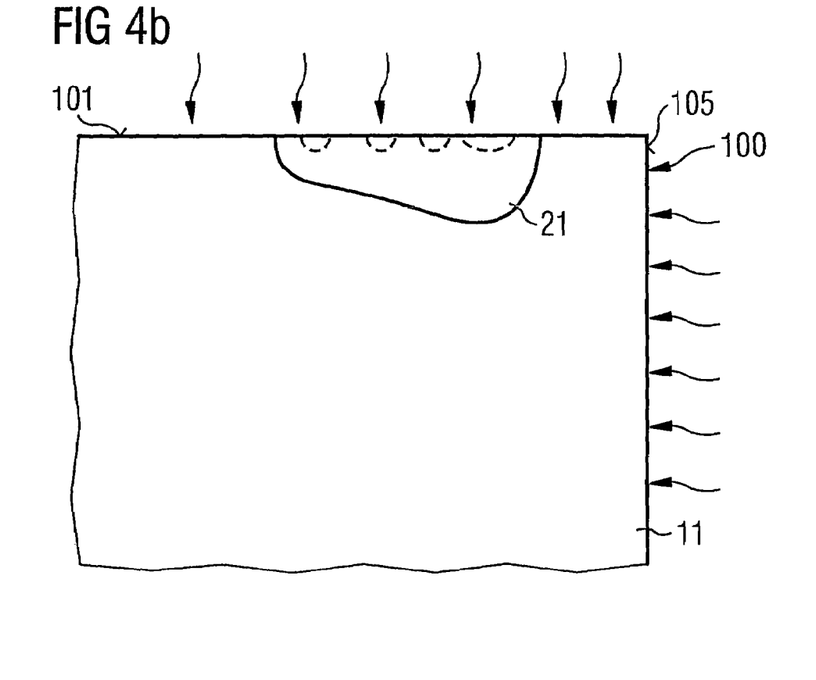

Referring to FIG. 4b, the implantation step explained above is followed by a thermal step during which the semiconductor body is heated for a predetermined time duration to a temperature suitable for indiffusion of the implanted dopant atoms. Said temperature is between 1200° C. and 1280° C., for example, when using phosphorus as dopant material. The duration of said thermal step is between 5 hours and 50 hours.

During this thermal step, the dopant atoms diffuse in all directions from the implantation regions 24 within the semiconductor body 100. The regions that arise as a result of outdiffusion from the individual implantation regions 24 are superimposed in this case to form a doped semiconductor zone forming a first semiconductor zone 21 of the channel stop zone 20. In the case of the method explained with reference to FIG. 4, it is possible, in particular, to produce a "nonsymmetrical" channel stop zone 20, that is to say to produce a channel stop zone in the case of which the dopant concentration does not decrease uniformly in all directions of the semiconductor body, rather in the case of which the region having a small gradient of the dopant concentration runs in a lateral direction toward the inner region 103 in a targeted manner. The dopant zone 22 is produced for example by virtue of the provision of a relatively wide opening for the ion implantation in the region in which said zone is intended to be produced.

It goes without saying that the method explained with reference to FIGS. 4a and 4b may also be followed by a further implantation process in order to produce a highly doped second semiconductor zone (22 in FIG. 1) in addition to the first semiconductor zone 21. In the context of this implantation step, it is possible in particular for dopant atoms such as phosphorus or selenium to be implanted into a region of the semiconductor body that is near the surface within the semiconductor zone 21 produced previously. This implantation is followed by a high-temperature step.

Figure 5:
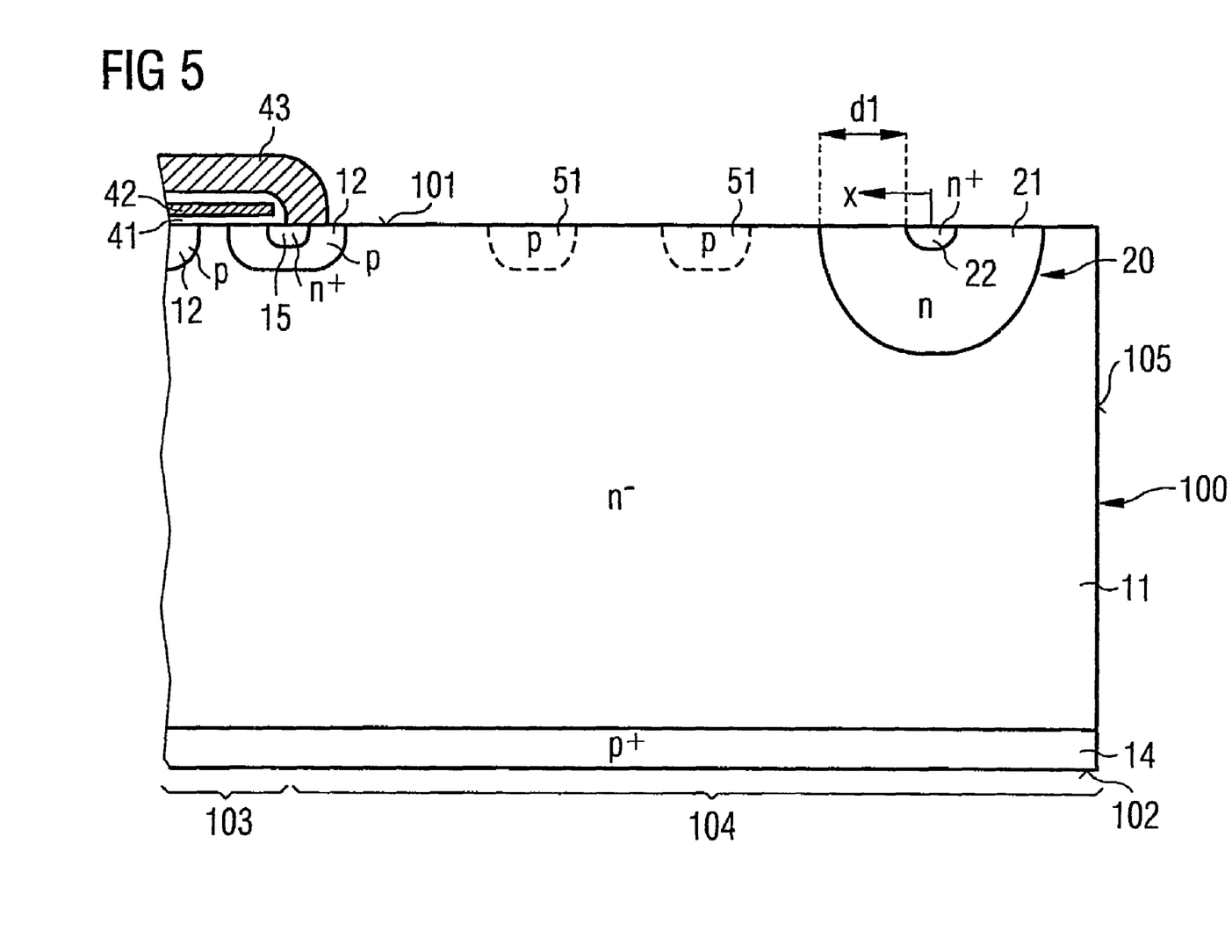
FIG. 5 shows a cross section through a semiconductor component formed as an IGBT and having a channel stop zone according to one embodiment.

It goes without saying that the use of the channel stop zone 20 according to one embodiment is not restricted to power diodes. Rather, the channel stop zone 20 may be used in any vertical power components. FIG. 5 shows the use of such a channel stop zone 20 in a component formed as an IGBT. In the case of this component, the semiconductor zone 12 doped complementarily to the basic doping of the semiconductor body 100 forms a p-type base, in which an n-doped semiconductor zone 15 is arranged, which forms the n-type emitter. There are usually a plurality of such p-type base zones 12 with n-type emitters 15 arranged therein. On order to form an electrically conducting channel between the n-type emitter 15 and the semiconductor region which has the basic doping and forms the n-type base of the IGBT, a gate electrode 42 is present, which is arranged in a manner insulated from the semiconductor body by a gate insulation 41. Said gate electrode 42 is arranged above the front side 101 in the example. In this case, a section having the basic doping extends in sections as far as the front side 101. The n-type emitter 15 is contact-connected by a terminal electrode 43, which preferably short-circuits the n-type emitter 15 and the p-type base 12.

Figure 6:
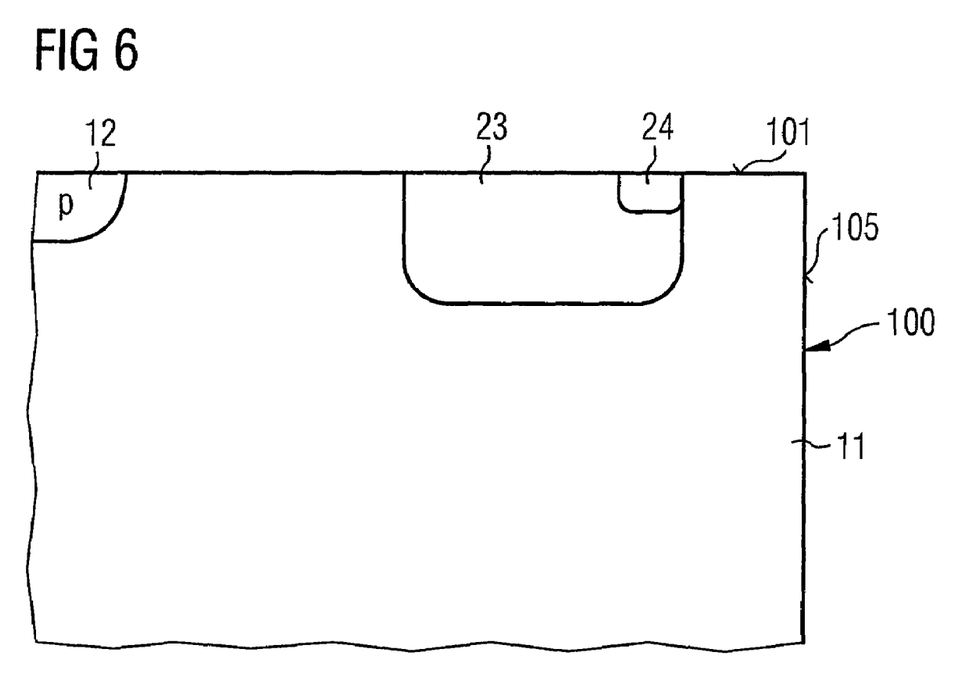
FIG. 6 shows a cross section through a semiconductor component having a channel stop zone in accordance with a further embodiment.

In an alternative configuration of the channel stop zone 20, referring to FIG. 6, provision is made for realizing said channel stop zone in two stages with a more weakly doped first semiconductor zone 23 and a more highly doped second semiconductor zone 24, the more weakly doped first semiconductor zone 23 being doped approximately homogeneously and being arranged in a lateral direction of the semiconductor body 100 between the active component zone 12 and the more highly doped second zone 24. The more weakly doped first semiconductor zone 23 may also be adjacent to the more highly doped semiconductor zone 24 in the vertical direction in the manner illustrated. Furthermore, the more weakly doped zone 23 may completely surround the more weakly doped zone 24 (in a manner that is not illustrated) within the semiconductor body 100.

In all the configurations of the channel stop zone explained above, it is also possible, of course, to take further measures for increasing the dielectric strength of the component. Such measures comprise, by way of example, the provision of field rings doped complementarily to the basic doping of the semiconductor body, said field rings being illustrated by dashed lines in FIGS. 1 and 5. Instead of field rings, it is also possible to provide a so-called VLD zone in the region of the front side 101, that is to say a semiconductor zone which is doped complementarily to the basic doping and the doping concentration of which decreases in the direction of the edge or the edge side 105 of the semiconductor component.

What is claimed is:

1. A semiconductor component comprising:
a semiconductor body having a basic doping and comprising a first side, a second side opposite the first side, an inner region arranged between the first and second sides, and an edge region adjacent to the inner region in a lateral direction,
at least one active component zone which is arranged in the inner region in the region of the first side and is doped complementarily to the basic doping, and
a channel stop zone, which is arranged in the edge region in the region of the first side, is of the same conduction type as the basic doping and is doped more heavily than the basic doping, the doping concentration in the channel stop zone decreasing continuously at least in sections in a lateral direction in the direction of the active component zone at least over a distance of 10 μm,
wherein the gradient of the doping concentration is between $5 \times 10^{14}$ cm$^{-3}$/μm and $5 \times 10^{11}$ cm$^{-3}$/μm.

2. A semiconductor component according to claim 1, wherein the doping concentration decreases continuously at least over a distance of 25 μm.

3. A semiconductor component according to claim 1, wherein the doping concentration in the channel stop zone decreases at least in sections in a vertical direction of the component in the direction of the second side.

4. A semiconductor component according to claim 1, wherein the channel stop zone extends into the semiconductor body further than the active component zone in a vertical direction proceeding from the first side.

5. A semiconductor component according to claim 1, wherein the channel stop zone has a first semiconductor zone and a second semiconductor zone, the second semiconductor zone being doped more heavily than the first semiconductor zone, and the doping concentration in the first semiconductor zone decreasing in a lateral and/or vertical direction proceeding from the second semiconductor zone.

6. A semiconductor component according to claim 5, wherein the doping concentration of the second semiconductor zone is between $10^{17}$ cm$^{-3}$ and $10^{20}$ cm$^{-3}$.

7. A semiconductor component according to claim 5, wherein the maximum doping concentration of the first semiconductor zone is between $10^{14}$ cm$^{-3}$ and $10^{16}$ cm$^{-3}$.

8. A semiconductor component according to claim 5, wherein the dimension of the first semiconductor zone in the lateral direction in the direction of the active component zone is between 10 μm and 200 μm, preferably between 25 μm and 200 μm.

9. A semiconductor component according to claim 1, wherein the first semiconductor zone has at least one of the following dopant atoms: phosphorus, selenium or sulfur.

10. A semiconductor component according to claim 5, wherein the second semiconductor zone has at least one of the following dopants: phosphorus, selenium or sulfur.

11. A semiconductor component according to claim 10, wherein the second semiconductor zone has phosphorus and selenium as dopant atoms.

12. A semiconductor component comprising:
a semiconductor body having a basic doping and comprising a first side, a second side opposite the first side, an inner region arranged between the first and second sides, and an edge region adjacent to the inner region in a lateral direction,
at least one active component zone which is arranged in the inner region in the region of the first side and is doped complementarily to the basic doping, and
a channel stop zone, which is arranged in the edge region in the region of the first side, is of the same conduction type as the basic doping and is doped more heavily than the basic doping, the doping concentration in the channel stop zone decreasing continuously at least over a distance of 25 μm,
wherein the gradient of the doping concentration is between $5 \times 10^{14}$ cm$^{-3}$/μm and $5 \times 10^{11}$ cm$^{-3}$/μm.

13. A semiconductor component according to claim 12, wherein the doping concentration in the channel stop zone decreases at least in sections in a vertical direction of the component in the direction of the second side.

14. A semiconductor component according to claim 12, wherein the channel stop zone extends into the semiconductor body further than the active component zone in a vertical direction proceeding from the first side.

15. A semiconductor component according to claim 12, wherein the channel stop zone has a first semiconductor zone and a second semiconductor zone, the second semiconductor zone being doped more heavily than the first semiconductor zone, and the doping concentration in the first semiconductor zone decreasing in a lateral and/or vertical direction proceeding from the second semiconductor zone.

16. A semiconductor component according to claim 15, wherein the doping concentration of the second semiconductor zone is between $10^{17}$ cm$^{-3}$ and $10^{20}$ cm$^{-3}$.

* * * * *

UNITED STATES PATENT AND TRADEMARK OFFICE
CERTIFICATE OF CORRECTION

PATENT NO. : 7,629,665 B2  Page 1 of 1
APPLICATION NO. : 11/428988
DATED : December 8, 2009
INVENTOR(S) : Barthelmess et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 728 days.

Signed and Sealed this

Second Day of November, 2010

David J. Kappos
*Director of the United States Patent and Trademark Office*